United States Patent [19]
McKim, Jr. et al.

[11] Patent Number: 5,214,407
[45] Date of Patent: May 25, 1993

[54] HIGH PERFORMANCE CURRENT SHUNT

[75] Inventors: James B. McKim, Jr., Blairstown; Robert D. Peck, Oak Ridge; Richard S. Myers, Somerville; William H. Pickel, Blairstown; Alan W. Cudworth, Clifton, all of N.J.

[73] Assignee: Hewlett-Packard Company, Palo Alto, Calif.

[21] Appl. No.: 788,404

[22] Filed: Nov. 6, 1991

[51] Int. Cl.$^5$ .............................................. H01C 7/00
[52] U.S. Cl. ........................................ 338/49; 338/120; 338/195
[58] Field of Search ........................ 338/49, 120, 195; 324/126

[56] References Cited

U.S. PATENT DOCUMENTS

| | | | |
|---|---|---|---|
| 3,252,091 | 5/1966 | Morgan | 338/49 |
| 4,475,099 | 10/1984 | Praria | 338/195 |
| 4,973,837 | 11/1990 | Weinstein et al. | 338/49 |
| 5,015,989 | 3/1991 | Wohlforth et al. | 338/195 |

Primary Examiner—Marvin M. Lateef

[57] ABSTRACT

A current shunt for converting a current to a voltage. The current shunt of the invention is made from a conductive material such as a high performance resistance alloy in sheet form which is sheared, punched, and bent to produce a highly stable current shunt with respect to time and temperature. Contact pins of current and potential connections are welded to the material using a fusion welding process, and techniques are also provided for isolating the potential contacts from the current contacts so as to improve stability. Trimming slits of the type used for thin film or foil resistors are also extended to bulk materials in accordance with the invention such that highly accurate resistances may be obtained. An integral heat sink and strain relief mechanism is also provided so as to minimize the adverse effects of temperature on the resistance of the material. The resulting current shunt has an extremely stable resistance value with respect to time and temperature at a minimal cost.

10 Claims, 6 Drawing Sheets

PRIOR ART

HIGH PERFORMANCE CURRENT SHUNT

BACKGROUND OF THE INVENTION

1. Field of the Invention

The present invention relates to a high performance current shunt for converting a current to a voltage. In particular, the present invention relates to a high performance current shunt formed from a resistance alloy in sheet form which is sheared, punched, and bent to produce a device which is extremely stable with respect to time and temperature.

2. Description Of The Prior Art

A current shunt for a power supply is typically a four terminal device which converts a current to a voltage. This voltage is used to program the current or to indicate its level. An example of a typical prior art precision current shunt 10 having four terminals is shown in FIG. 1.

Figure 1:
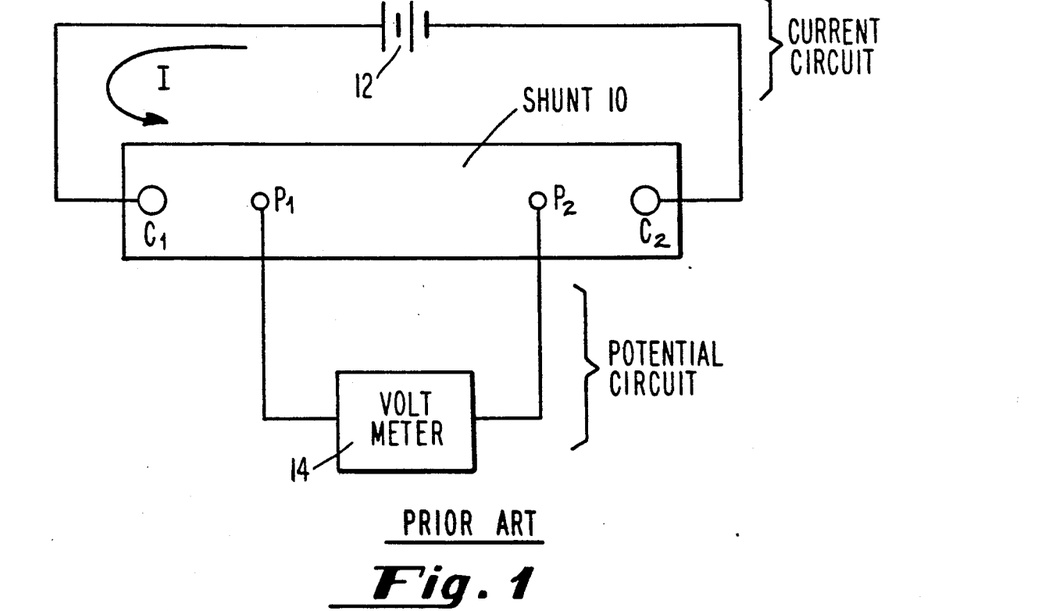
FIG. 1 illustrates a typical prior art current shunt wherein the potential connections $P_1$ and $P_2$ are in the current path between the current connections $C_1$ and $C_2$.

As shown in FIG. 1, two terminals are located at each end of the resistive element. One set of terminals, $C_1$ and $C_2$, one terminal at each end, are used as current contacts, while a second set of terminals, $P_1$ and $P_2$, are used as potential (or voltage sensing) contacts. The potential contacts $P_1$ and $P_2$ are typically located inside the current contacts $C_1$ and $C_2$ so that they sense a portion of the potential drop in the current path including battery 12 and current contacts $C_1$ and $C_2$. A high impedance metering circuit (or voltmeter) 14 is used to monitor this potential drop as shown, and because of its high impedance, no current flows in the potential circuit. The accuracy of the resulting measurement of current is thus largely independent of variations in the quality of the electrical connections to both the current and the potential contacts. This type of connection scheme is sometimes referred to in the prior art as a Kelvin contact. The need for this feature increases as the effective resistance of a shunt decreases since it becomes progressively more difficult to make precisely repeatable connections to the current terminals. Similar, although less stringent, considerations apply to the potential circuit.

As the desired precision of the current shunt increases, the design of the potential connection becomes increasingly critical so that subtler effects on the device's precision must be taken into consideration. For example, prior art four terminal current shunts of the type shown in FIG. 1 achieve modest performance by using screw terminations for the potential connections $P_1$ and $P_2$. However, since the potential terminals $P_1$ and $P_2$ are located in the current path between the current contacts $C_1$ and $C_2$, the screw connections may "creep" slightly with mechanical variations caused by device temperature changes, thus introducing errors by effectively moving the potential contact points $P_1$ and $P_2$ in the current path. As still further precision is desired, soldered or welded potential terminals have been proposed in the prior art. Connections of this type avoid the aforementioned problems of mechanical variability; however, since the actual contacts $P_1$ and $P_2$ remain in the current path, some portion of the current flows through the solder connection or the weld nugget and through the base of the potential contact lead so as to introduce further errors in the output current measurement.

The materials typically used for the prior art shunt resistance element 10 are generally selected to have very low temperature coefficients of resistance. Solders and the lead materials (which typically are copper) have much higher temperature coefficients of resistance and also have much lower resistivities. Thus, even though the potential contact shunts out a small portion of the shunt resistance element 10 and thus contributes only marginally to the total effective resistance of the device, the potential contact shunts still make a disproportionately large contribution to the overall temperature coefficient of resistance of the finished device since the materials in the region of the potential contact have much higher temperature coefficients of resistance. In addition, because of the dissimilar metals with different thermal EMFs at the potential contacts, temperature differences across the shunt resistance may develop. These effects become increasingly significant as the desired precision of the device is increased. It is desired to develop a current shunt which is specifically designed to minimize these effects.

It is also desired to develop techniques for enabling the resistance value of the shunt resistance element 10 to be very carefully controlled. As known to those skilled in the art, the resistance value of the shunt resistance element 10 varies in accordance with the characteristics of the material used for the shunt resistance element 10 as well as the respective dimensions of the shunt resistance element 10. Accordingly, the resistance value of the shunt resistance element 10 has been controlled in prior art current shunts by carefully selecting the material used for the shunt resistance element 10 and by mechanically trimming (or grinding) the shunt resistance element 10 until it has the desired resistance value. Such an approach is tedious and not easily reproducible. Accordingly, it is desired to extend the thin film or foil resistance element forming techniques used in the manufacture of semiconductor devices to the techniques of manufacturing current shunts from bulk materials so that the resistance of the shunt resistance element 10 may be more accurately controlled.

Accordingly, a need remains in the art for a current shunt which has a resistance value which is extremely stable with respect to time and temperature. It is desired to provide such a current shunt while minimizing manufacturing and development costs.

SUMMARY OF THE INVENTION

The above-mentioned needs in the art have been met in accordance with the invention by providing a current shunt formed of a high-performance resistance alloy in sheet form which is sheared, punched, and bent. Contact pins for the current and potential connections are then welded to the current shunt using a fusion welding process. The current shunt of the invention exhibits moderate accuracy for absolute resistance but extremely low temperature coefficients and thermal EMFs. Moreover, when used in conjunction with a microprocessor based error correction process for correction of absolute resistance in conventional power supplies, the current shunt in accordance with the invention provides exceptional current mode performance for both programming and for readback modes.

The present invention has at least five novel characteristics which distinguish it from current shunts of the prior art. Namely, the potential contact of the current shunt of the invention is designed to include isolating structures in the sheet portion of the device so that the effective potential contact is made in the sheet material itself. As a result, none of the potential drop occurs in the vicinity of the contact pin. Trimming and current diverting slits are also provided within the body of the current shunt so as to effectively raise the resistance of the current shunt when low resistivity material is used, thereby enabling resistance variations to be compensated. An integral heat sink is also provided so as to avoid the effects such as the introduction of high impedance parallel current paths which compromise shunt performance as when a heat sink is added during the manufacturing process. Preferably, the integral heat sink is formed in the sheet material itself by providing more surface area for dissipating heat so as to avoid hot spots. Means are also added for providing strain relief of the current shunt so that errors are not introduced by mechanical strain. Finally, the current shunt of the invention is further characterized by the use of welded contacts for connecting the current and potential connections to the sheet resistance material forming the shunt resistance. Welding the contacts has been found to eliminate errors caused by heat affected zones introduced by the soft-soldering or silver-soldering connections used for the attachment of the contacts in prior art devices. As desired, the combination of these features of the invention leads to a current shunt with an extremely stable resistance value with respect to time and temperature at a minimized cost.

In a preferred embodiment, the present invention relates to a high-performance current shunt for converting a current to a potential precisely proportional to the current flow through the current shunt. Preferably, such a current shunt in accordance with the invention comprises first and second current connections responsive to the input current, first and second potential connections for providing the output potential, and a resistive element. The resistive element is preferably formed of a sheet of material with a low temperature coefficient of resistance versus temperature. The current connections and potential connections are preferably disposed thereon so as to define a current path between the first and second current connections such that a proportion of a potential drop between the first and second current connections may be sensed at the first and second potential connections. The resistive element preferably further includes a first slit between the first and second current connections for diverting the current flow in the current path around the first slit so as to control the location of heat dissipation and for trimming a resistance value of the resistive element, as well as a second slit for isolating the first and second potential connections from the current path between the first and second current connections.

In accordance with other aspects of the invention, the first and second current and potential connections are fusion welded to respective ends of the resistive element. Also, the resistive element preferably further comprises an integral heat sink into which the current flow is diverted by the first slit for purposes of heat dissipation via the integral heat sink. The resistive element may also comprise means for relieving strain caused by thermal expansion of the material. In a first embodiment of the invention, the strain relieving means comprises a third slit in the integral heat sink which extends in a direction substantially perpendicular to a mounting direction of the resistive element, while in a second embodiment of the invention, the strain relieving means comprises at least one bend in the direction substantially perpendicular to the mounting direction of the resistive element.

In accordance with other aspects of the invention, the first slit has a size adjustable in accordance with the error tolerance of the resistive element. The resistive element also is preferably a composition comprising by weight approximately 72% nickel, 20% chromium, 3% aluminum, 4% manganese, and 1% silicon and has a surface area to power dissipation ratio of approximately 0.5 Watts per square inch when cooled by forced air. Also, the resistive element preferably has a thickness which enables it to be self-supporting (e.g., approximately 0.020 inch).

BRIEF DESCRIPTION OF THE DRAWINGS

The objects and advantages of the invention will become more apparent and more readily appreciated from the following detailed description of the presently preferred exemplary embodiments of the invention taken in conjunction with the accompanying drawings, of which:

FIGS. 4(a)–4(d) illustrate respective views of a current shunt in accordance with a preferred embodiment of the invention.

FIGS. 5(a)–5(c) illustrate respective views of an alternative embodiment of a current shunt in accordance with the invention. FIG. 5(a) illustrates the current shunt before it is bent (FIG. 5(b)) for mounting, while

FIGS. 6(a)–6(c) illustrate respective views of another alternative embodiment of a current shunt in accordance with the invention. FIG. 6(a) illustrates the current shunt before it is bent (FIG. 6(b)) for mounting, while

DETAILED DESCRIPTION OF THE PRESENTLY PREFERRED EMBODIMENTS

The inventors of the subject matter disclosed and claimed herein have satisfied the above-mentioned needs in the art by developing a current shunt which has a resistance value which is extremely stable with respect to time and temperature. A current shunt with the above-mentioned beneficial features will be described below with respect to FIGS. 2–7 for presently preferred exemplary embodiments of the invention. However, it will be appreciated by those of ordinary skill in the art that the description given herein with respect to those figures is for exemplary purposes only and is not intended in any way to limit the scope of the invention. All questions regarding the scope of the invention may be resolved by referring to the appended claims.

Figure 2A:
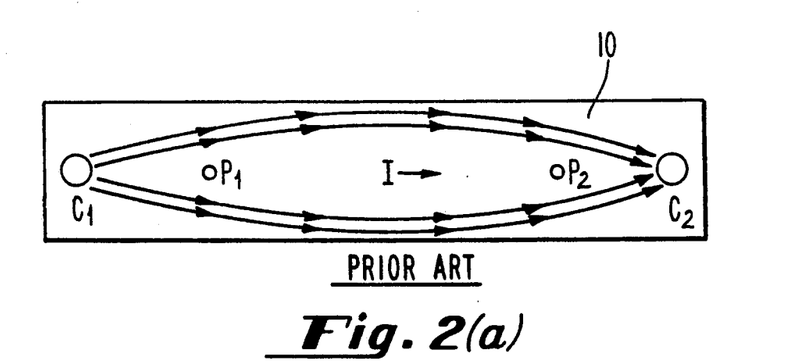
FIGS. 2(a) and 2(b) respectively illustrate the current path through the prior art current shunt of FIG. 1 (FIG. 2(a)) and the current path through the current shunt in accordance with the invention (FIG. 2(b)).

As noted in the background portion of the specification, a current shunt 10 of the type illustrated in FIG. 1 may introduce errors into the output measurement in that the potential contacts $P_1$ and $P_2$ are disposed in the current path between current contacts $C_1$ and $C_2$. The current flow through current shunt 10 is illustrated in FIG. 2(a), where, as shown, the current flows through the potential contacts $P_1$ and $P_2$. However, the present inventors have discovered that if an isolating structure is provided to prevent current flow in the body of the current shunt where the potential contact is made, both mechanical and temperature coefficient of resistance induced errors can be eliminated. The effective potential contact then becomes integral to the resistance element while the physical connection becomes part of the high impedance potential circuit where variations in contact quality have no impact on accuracy.

Figure 2B:
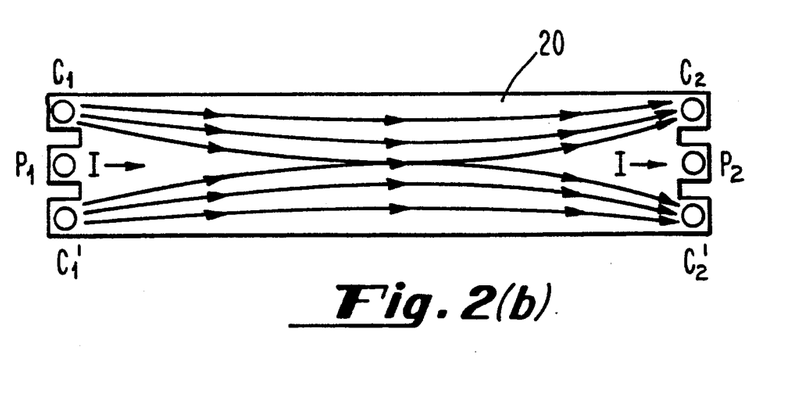

In accordance with the invention, the potential contact is designed to have isolating structures in the sheet portion of the current shunt so that the effective potential contact is made in the sheet material itself. As shown in FIG. 2(b), this may be done by placing slits in the sheet material to isolate the copper contact pin ($P_1$ or $P_2$) from the current path. Consequently, none of the potential drop occurs in the vicinity of the contact pin or the weld "nugget" where mixing of copper with the resistance alloy produces uncertain properties.

Figure 3A:
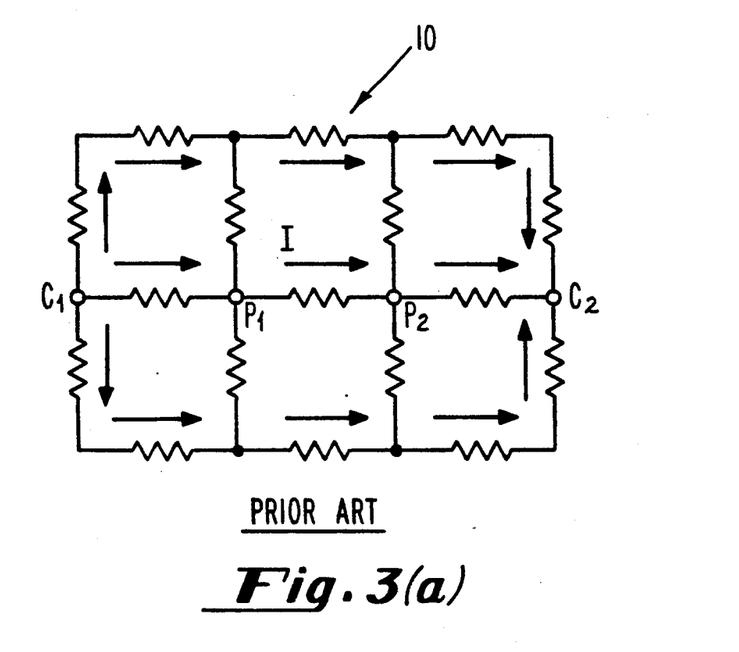
FIGS. 3(a) and 3(b) together illustrate how the potential connections $P_1$ and $P_2$ of the invention are isolated from the current path in accordance with the techniques of the invention.
Figure 3B:
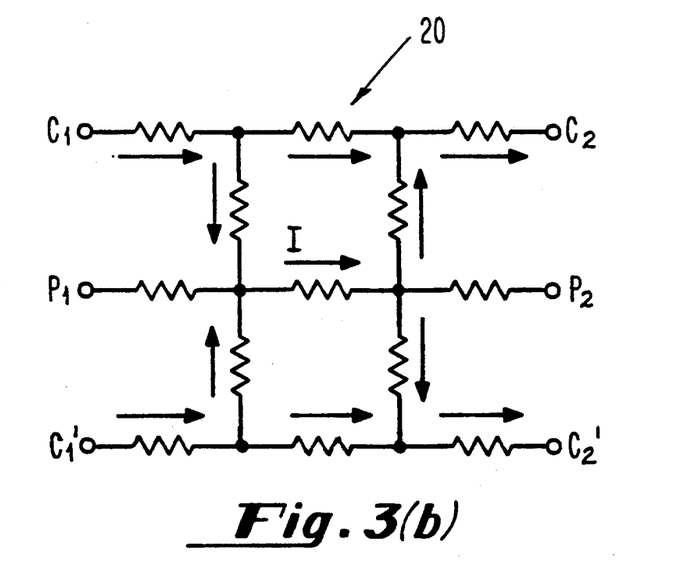
Figure 4A:
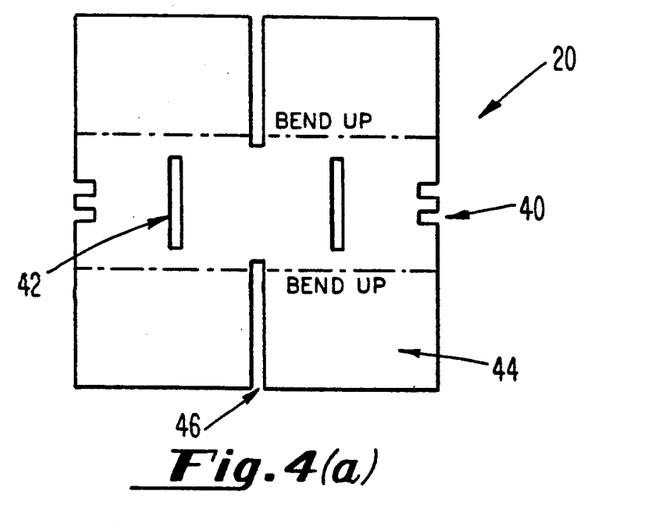
FIG. 4(a) illustrates the current shunt of the invention before it is bent (FIG. 4(b)) for mounting, while FIGS. 4(c) and 4(d) respectively illustrate side and top views of the current shunt of the FIG. 4(a) as bent.
Figure 4B:
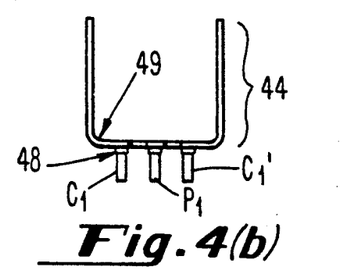
Figure 4C:
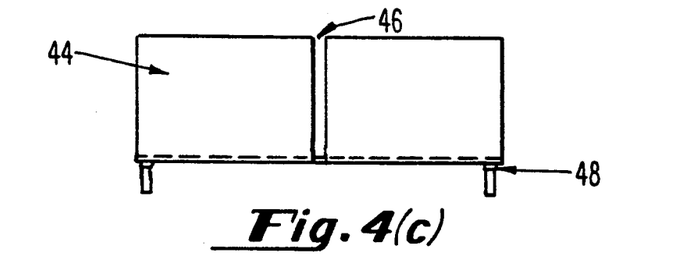
Figure 4D:
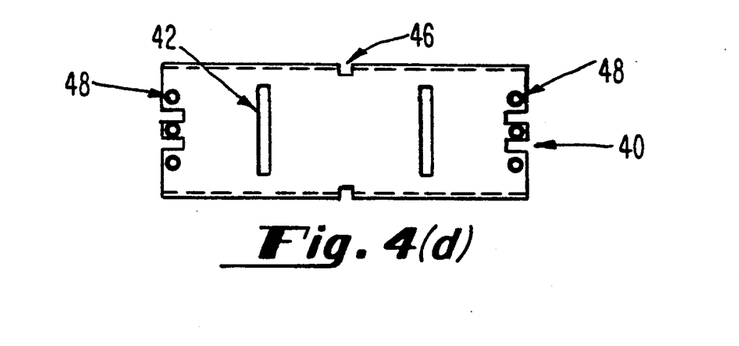

The current path through the current shunt 20 (FIG. 2(b)) of the invention does not include the potential contacts $P_1$ and $P_2$ as in the prior art current shunt 10 of FIG. 2(a) and thus does not introduce the aforementioned errors into the output measurement. This distinction is illustrated more graphically in FIGS. 3(a) and 3(b), where FIG. 3(a) illustrates the prior art current shunt 10 in which the current flows through potential contacts $P_1$ and $P_2$ as it traverses from current contact $C_1$ to current contact $C_2$, and FIG. 3(b) illustrates the current shunt 20 of the invention in which the current flow does not pass through the potential contacts $P_1$ and $P_2$. Hence, although the effective potential contacts are in the sheet material itself, the physical potential contacts $P_1$ and $P_2$ are effectively isolated from the current path so as to avoid any performance uncertainty caused by the presence of dissimilar metals at the junction between the physical terminal and the resistance element. As will be described in more detail below with respect to FIGS. 4-6, this potential contact isolation is generally provided by forming slits between the current and potential contacts.

FIG. 4 illustrates a presently preferred embodiment of the current shunt of the invention. FIG. 4(a) illustrates the current shunt of the invention while it is still in sheet form before being bent for mounting, while FIG. 4(b) illustrates an end view of the sheet of FIG. 4(a) after it has been bent for mounting. FIG. 4(c) illustrates a side view of the bent sheet of FIG. 4(a), while FIG. 4(d) illustrates a top view of the bent sheet of FIG. 4(a). As shown, the current shunt 20 of FIGS. 4(a)-(d) preferably has slits 40 for isolating the potential contacts $P_1$ and $P_2$ from the current contacts $C_1$ and $C_2$ for the reasons described above with respect to FIGS. 2 and 3. However, the current shunt 20 of FIGS. 4(a)-(d) is further characterized by trimming and current diverting slits 42, integral heat sink (or "wings") 44 and strain relief slits 46. Also, the potential and current contact pins are preferably welded at 48 to the current shunt 20 of the invention in accordance with known fusion welding techniques. The current shunt is also bent at 49 as illustrated prior to mounting so as to maximize surface area for cooling purposes and to facilitate mounting.

Slit trimming of resistive devices is a well established technique frequently used when the resistive element is a thin film or foil. In accordance with such techniques, the fabricator compensates for variations in thickness and resistivity by trimming the film or foil. A fixed overall dimension for the device is maintained while trimming for virtually any desired level of accuracy at the device terminals. However, such techniques have not previously been used for resistive materials of the type used in the manufacture of current shunts. Instead, techniques such as grinding of the edges of the materials have been used to trim prior art current shunts, which is labor intensive and difficult to repeat exactly.

To overcome the aforementioned trimming problems, the present inventors have extended the technique of slit trimming to bulk materials (i.e., 0.020" thick sheets) for adjusting the resistance of the sheet to a desired value, thereby compensating for resistance variation caused by variations in the thickness of the sheet and the like which occur during its manufacture. This makes it unnecessary to accurately control the thickness of the sheet during manufacture of the current shunt of the invention. Preferably, as shown in FIG. 4, the trimming and current diverting slits 42 are formed within the body of the current shunt 20 during manufacture. In other words, current shunt 20 is not individually trimmed; instead, unavoidable variability in the electrical and mechanical properties of the sheet material from lot to lot is adjusted to a nominal value by deliberately incorporating trimming and current diverting slits 42 rather than redesigning the current shunt 20. For example, the size of the trimming and current diverting slits 42 may vary with each lot of material depending upon the resistive characteristics of the particular lot. The trimming and current diverting slits 42 raise the effective resistance of the current shunt 20 when low resistivity material is used and can be gradually eliminated to hold tolerance for absolute resistance when higher resistivity material is used. Without the trimming and current diverting slits 42 in accordance with the invention, the current shunt 20 of the invention would have approximately a $+/-20\%$ tolerance of absolute resistance. However, when trimming and current diverting slits 42 are used in accordance with the invention to adjust for material falling into eight ranges, tolerances better than $+/-5\%$ have been obtained.

The trimming and current diverting slits 42 also provide another novel function in accordance with the invention. In particular, the trimming and current diverting slits 42 force the current flow into certain portions of the current shunt 20. This feature of the trimming and current diverting slits 42 may be used to direct the current to, for example, an integral heat sink (or "wings") 44 of the current shunt 20 for purposes of more efficiently dissipating heat. By controlling current flow in this manner, improved potential contacts of the type described above as well as improved thermal performance may be achieved.

As just noted, improved thermal performance may be achieved by providing the resistance sheet material with an integral heat sink 44. As known to those skilled in the art, one of the concerns in the design of any high current shunt is power dissipation which leads to both temperature coefficient of resistance and thermal EMF effects. Unfortunately, simply attaching a heat sink to the current shunt introduces various other effects which compromise shunt performance in complex and not well understood ways. These effects include strain, introduction of high impedance parallel current paths, and the like. Adding a heat sink also makes the manufacturing process more complex and adds cost to the device. In order to avoid these problems, the higher current versions of current shunt 20 in accordance with the invention preferably include integral "wings" 44 of the sheet material itself to increase surface area and to improve thermal performance. Those skilled in the art will appreciate that integral heat sinks 44 are not necessary for all designs but only for devices exhibiting relatively high power dissipations.

Since the current shunt 20 in accordance with the invention is primarily cooled by convection aided by forced air, the current shunt 20 of the invention has been designed to maintain a surface area to power dissipation ratio of roughly 0.5 Watts per square inch. During operation, some portion of the dissipation of heat is also conducted out the leads of the device into a circuit board on which the device is mounted. For a 5 milliohm current shunt 20, two trimming and current diverting slits 42 may also be provided to have the aforementioned function of forcing current flow up into the "wing" structures 44 in order to locate a greater portion of the dissipation more advantageously relative to an anticipated flow of cooling air, thereby improving thermal performance. Thermal performance is further improved in that a junction of dissimilar metals at the connection to the heat sink is not necessary.

As known to those skilled in the art, temperature may cause strain effects in the current shunt 20 because of the effects of thermal expansion of the resistive material. The current shunt 20 of FIG. 4 has been particularly designed to address this problem by providing strain relief slits 46 within the "wings" 44 along the long axis parallel to the mounting direction for purposes of avoiding the compressive stresses caused by thermal expansion. However, as will be described below with respect to FIGS. 5 and 6, strain relief may also be achieved by bending the sheet material in a direction perpendicular to the long axis direction in the mounting direction so as to avoid the compressive stresses caused by thermal expansion. In this manner, mechanical strain caused by temperature expansion may be minimized so as to enhance the stability of the resistance value with respect to time and temperature.

As previously described, the present invention also uses welded contacts for the current and potential connections. While welding technology has been used by some manufacturers of wire wound resistors including four-terminal current shunts, isolated welded contacts on a sheet resistance material (as opposed to ribbon material used in a wound-on-a-body type configuration) are not known in the prior art. Instead, prior art current shunts typically have either soft-soldered or silver-soldered current and potential connections which introduce the problems with dissimilar junctions noted above. By using welded connections for both the current and the potential contacts, the present invention provides numerous benefits including: (1) the contacts are mechanically stable; (2) the physical size of the contact may be more precisely controlled and in the case of the potential contacts is typically smaller than a soldered contact; (3) the thermally effected zone in the resistance element may be small if fusion welding techniques are used as opposed to soldering, brazing or other welding techniques; and (4) if solderable pins are welded to the device, the resulting component is compatible with volume manufacturing technologies such as wave soldering. The first three of these benefits contribute to improved performance in the finished device, while the fourth benefit improves the cost effectiveness of the current shunt of the invention.

Although prior art current shunts are typically formed of alloys of materials such as manganin and constantan, the present inventors have discovered that desirable results are achieved when the current shunt 20 is formed of an Evanohm ™ S resistance alloy. Such a resistance alloy is presently preferred since it provides optimum stability and flexibility with regard to both size and required temperature coefficient of resistance. This alloy also has an extremely low EMF versus copper together with a high electrical resistivity as is highly desirable in a precision resistance element. The Evanohm ™ S resistance alloy is generally formed of nickel and chromium and is typically used in strain gauges and precision foil resistors. The alloy used in a preferred embodiment of the invention has the following nominal composition: nickel 72%, chromium 20%, aluminum 3%, manganese 4% and silicon 1%. Such a material has a thermal coefficient of expansion of approximately $13.0 \times 10^{-6}$ °C. and a thermal conductivity of 0.146 W/cm/°C. In addition, such a material has a resistivity of approximately 825 ohms cir mil/ft and a thermal EMF versus copper of +0.2 microvolts/°C. (0°-100° C.). Since contact attachment to an alloy of this type has been found to be difficult, particularly for bulk materials on the order of 0.020" thickness, the aforementioned fusion welding technique has been developed in accordance with the invention.

Those skilled in the art will appreciate that the material chosen for the resistance element of the invention preferably has a low temperature coefficient of resistance versus temperature as well as a low thermal EMF with respect to copper. Also, as known to those skilled in the art, stability of the current shunt of the invention may be enhanced by providing a stabilization bake of the current shunt after fabrication at a relatively low temperature such as 250° F. Accordingly, other similar materials may be used to achieve the benefits of the invention as would be apparent to those of ordinary skill in the art.

Figure 5A:
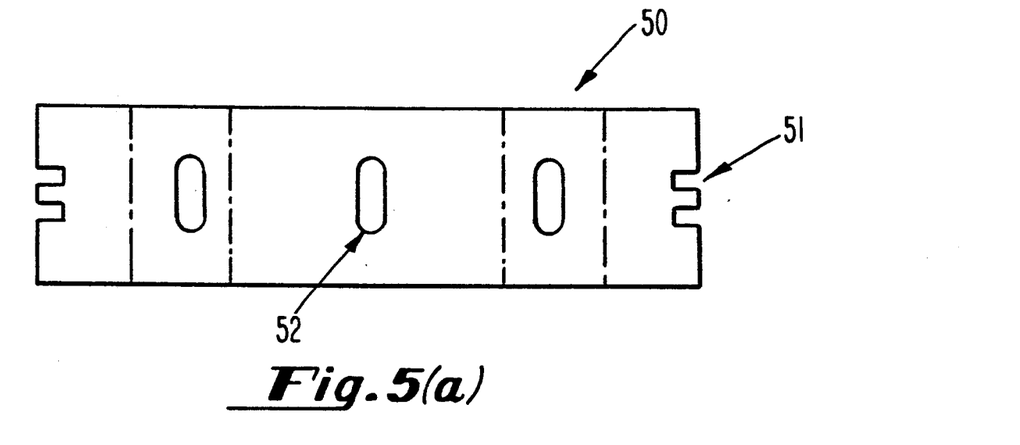
Figure 5B:
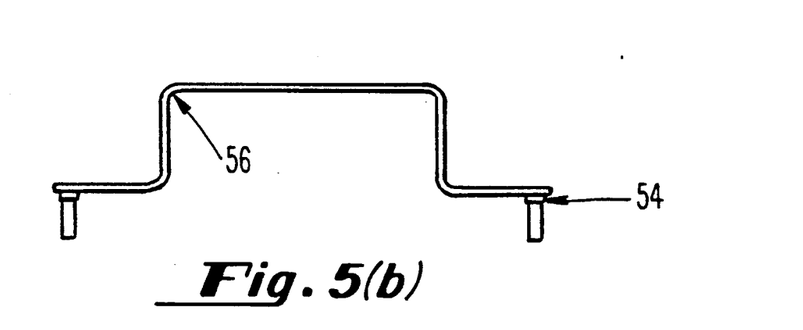
Figure 5C:
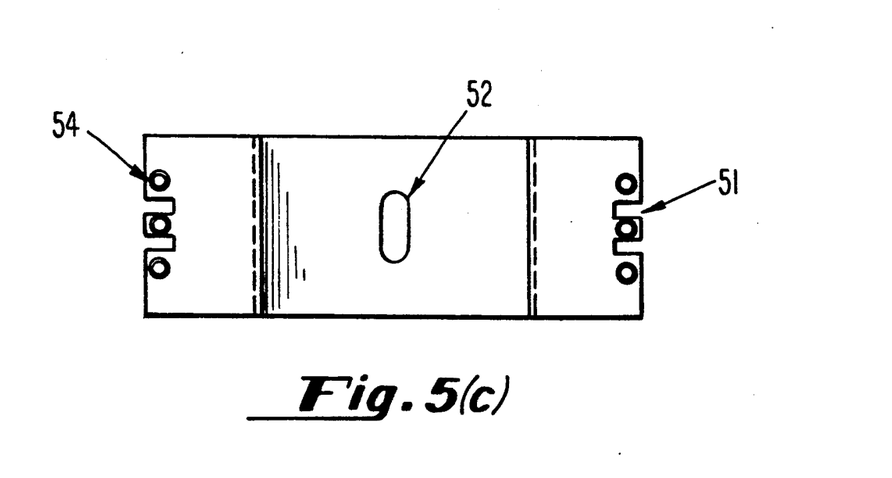
FIG. 5(c) illustrates a top view of the current shunt of FIG. 5(a) as bent.

FIGS. 5(a)-5(c) illustrate an alternative embodiment of the current shunt of the invention. As illustrated, current shunt 50 also has the slits 51 for isolating the potential contacts from the current contacts and trimming and current diverting slits 52 as well as welded connections 54 for connecting the current contacts and the potential contacts to the current shunt 50 as described above with respect to FIG. 4. However, the embodiment of FIG. 5 further includes transverse bends 56 for providing strain relief rather than the slits 46 as in the embodiment of FIG. 4. As shown, the sheet material is preferably folded into a "top hat" design before mounting by bending the resistive sheet along the long mounting axis to avoid compression stresses caused by thermal expansion with respect to the mounting points. This shape allows the surface area to be maximized without changing the resistance value of the current shunt 50 while also minimizing the effects of strain due to thermal expansion. Also, in the embodiment of FIG. 5 the integral heat sink is formed in the sheet material itself without the addition of "wings" 44 as in the embodiment of FIG. 4.

Figure 6A:
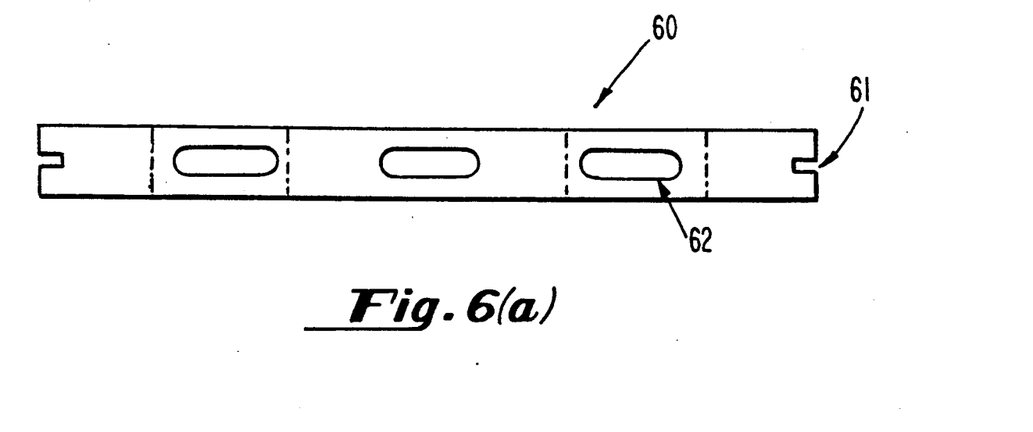
Figure 6B:
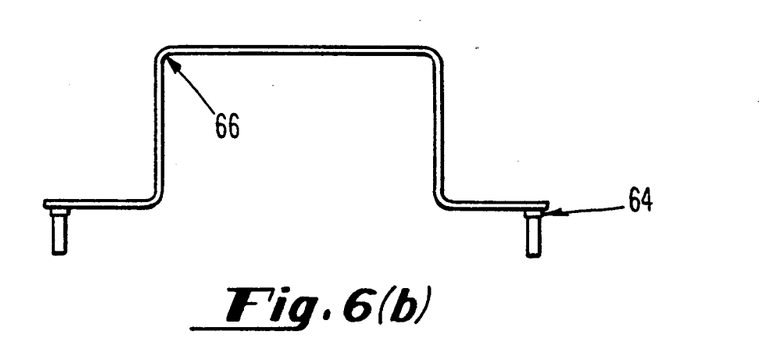
Figure 6C:
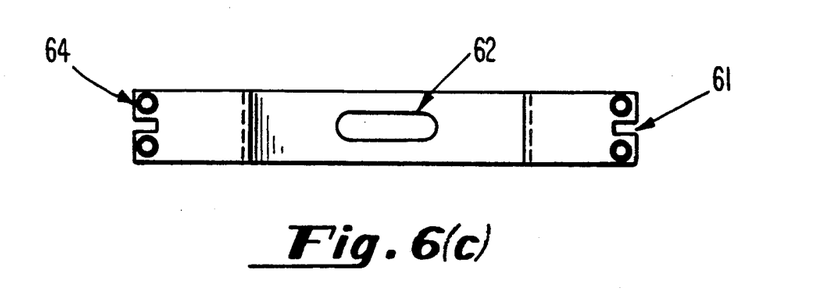
FIG. 6(c) illustrates a top view of the current shunt of FIG. 6(a) as bent.

FIGS. 6(a)-6(c) illustrate another embodiment for lower power usage which is very similar to that of FIG. 5. In the embodiment of FIG. 6, current shunt 60 includes isolating slits 61, trimming and current diverting slits 62, welded contacts 64 and bends 66 as in the embodiment of FIG. 5. However, in this embodiment, a single pair of current connections $C_1$ and $C_2$ and a single pair of potential connections $P_1$ and $P_2$ are provided and less heat sinking is available. As in the embodiment of FIGS. 4 and 5, this embodiment maximizes the surface area of the resistive element without changing the resistance value of the overall current shunt and is bent so as to minimize strain due to thermal expansion. As shown, a "top hat" shape is presently preferred for this purpose.

Figure 7:
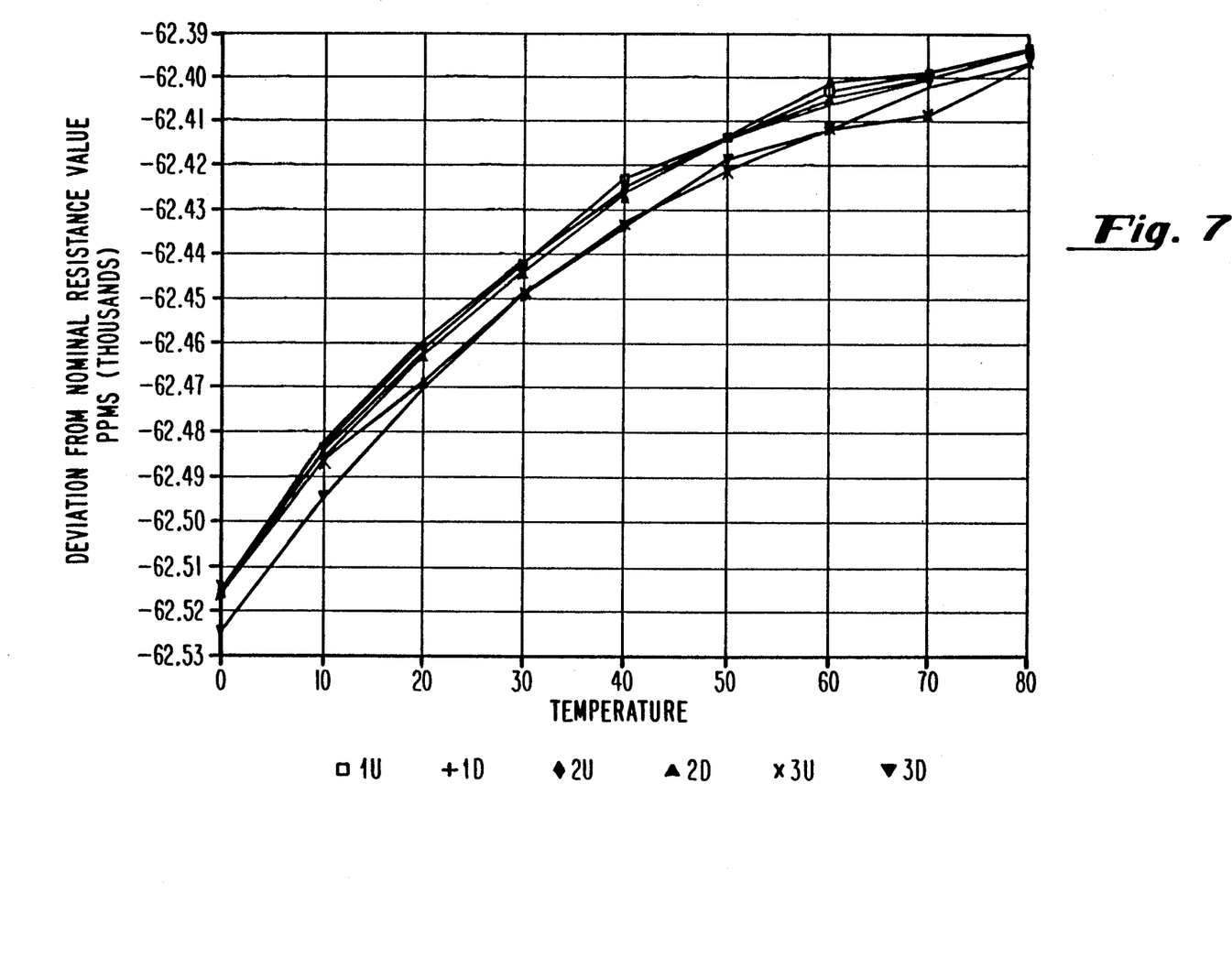
FIG. 7 illustrates the absolute change in resistance with respect to temperature for the current shunt of the invention.

Accordingly, the present invention relates to a current shunt which achieves greatly enhanced resistance stability with respect to time and temperature without sacrificing performance. For example, FIG. 7 illustrates resistance stability versus temperature for the current shunt of the invention. In particular, FIG. 7 illustrates deviation from a nominal resistance value as the current shunt is repeatedly heated from 0° C. to 80° C. and then cooled back to 0° C. for measuring hysteresis effects. As illustrated, minimal change in resistance for changes in temperature are measured for the current shunt of the invention.

Although three exemplary embodiments of the invention have been described in detail above, those skilled in the art will readily appreciate that many additional modifications are possible in the exemplary embodiments without materially departing from the novel teachings and advantages of the invention. Accordingly, all such modifications are intended to be included within the scope of this invention as defined in the following claims.

We claim:

1. A high-performance current shunt for converting a current applied thereto into a potential which is precisely proportional to the current flow through said current shunt, the proportionality between said current and said potential being substantially independent of changes in ambient temperature and the magnitude of current flow through said current shunt, said current shunt comprising:

first and second current connections responsive to said input current;

first and second potential connections for providing said output potential, said first and second potential connections being spaced so as to define an effective resistance value for said current shunt; and a resistive element formed of a sheet of material having a known temperature coefficient of resistance, said resistive element having said current connections and potential connections disposed thereon so as to define a current path between said first and second current connections whereby a proportion of a potential drop between said first and second current connections may be sensed at said first and second potential connections, said resistive element further including a first slit between said first and second current connections for diverting the current flow in said current path around said first slit so as to control the location of heat dissipation and to thereby prevent localized heating of said resistive element and the resultant temperature induced changes in said effective resistance and in the sensed proportion of said potential drop between said first and second current connections in said current path, and a second slit for electrically isolating said first and second potential connections from that portion of said current path between said first and second current connections at which said proportion of said potential drop is sensed, thereby eliminating variation in said temperature coefficient of resistance of said material in said current path as a result of material impurities introduced by connection of said first and second potential connections to said resistive element.

2. A current shunt as in claim 1, wherein said first and second current and potential connections are fusion welded to respective ends of said resistive element.

3. A current shunt as in claim 1, wherein said resistive element is a composition comprising by weight approximately 72% nickel, 20% chromium, 3% aluminum, 4% manganese, and 1% silicon.

4. A current shunt as in claim 1, wherein said resistive element further comprises an integral heat sink into which the current flow is diverted by said first slit for purposes of heat dissipation via said integral heat sink.

5. A current shunt as in claim 4, wherein said resistive element further comprises means for relieving strain caused by thermal expansion of said material.

6. A current shunt as in claim 5, wherein said strain relieving means comprises a third slit in said integral heat sink which extends in a direction substantially perpendicular to an axis through mounting points of said resistive element.

7. A current shunt as in claim 5, wherein said strain relieving means comprises at least one bend in a transverse direction of said resistive element between mounting points of said resistive element.

8. A current shunt as in claim 1, wherein said first slit has a size adjustable in accordance with the error tolerance of said resistive element.

9. A current shunt as in claim 1, wherein said resistive element has a thickness such that it is self-supporting.

10. A current shunt as in claim 9, wherein said resistive element has a thickness of approximately 0.020 inch.

* * * * *